(12) United States Patent
Watanabe et al.

(10) Patent No.: US 9,941,095 B2
(45) Date of Patent: Apr. 10, 2018

(54) CHARGED PARTICLE BEAM APPARATUS

(71) Applicant: Hitachi High-Technologies Corporation, Minato-ku, Tokyo (JP)

(72) Inventors: Ryota Watanabe, Tokyo (JP); Yuko Sasaki, Tokyo (JP); Akira Ikegami, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/183,952

(22) Filed: Jun. 16, 2016

(65) Prior Publication Data
US 2016/0379795 A1    Dec. 29, 2016

(30) Foreign Application Priority Data

Jun. 29, 2015  (JP) ................................ 2015-129459

(51) Int. Cl.
*H01J 37/21* (2006.01)
*H01J 37/28* (2006.01)

(52) U.S. Cl.
CPC .............. *H01J 37/21* (2013.01); *H01J 37/28* (2013.01); *H01J 2237/2448* (2013.01); *H01J 2237/24578* (2013.01); *H01J 2237/281* (2013.01)

(58) Field of Classification Search
USPC ......... 250/396 R, 397, 492.1, 492.2, 492.21, 250/492.22, 492.23, 492.3, 306, 307, 309, 250/310, 311
See application file for complete search history.

(56) References Cited

U.S. PATENT DOCUMENTS

| 7,888,640 B2 | 2/2011 | Tachibana et al. |
| 8,759,761 B2 | 6/2014 | Doi |
| 8,946,649 B2 | 2/2015 | Sasaki et al. |
| 9,679,738 B2 * | 6/2017 | Matsumoto ...... G01N 23/20058 |
| 2012/0217391 A1 * | 8/2012 | Shichi ..................... H01J 27/26 250/306 |
| 2016/0196952 A1 * | 7/2016 | Matsumoto ...... G01N 23/20058 250/305 |

FOREIGN PATENT DOCUMENTS

| JP | 5478683 B2 | 4/2014 |
| JP | 5553489 B2 | 7/2014 |
| JP | 5663412 B2 | 2/2015 |

* cited by examiner

*Primary Examiner* — Nicole Ippolito
(74) *Attorney, Agent, or Firm* — Crowell & Moring LLP

(57) ABSTRACT

An object of the invention is to provide a charged particle beam apparatus which can perform optimized adjustment of a focusing condition of a charged particle beam focused on a sample and optimized adjustment of an orbit of a charged particle emitted from the sample. In order to achieve the above-described object, there is provided a charged particle beam apparatus including a passage restriction member that partially restricts passage of a charged particle emitted from a sample, a first lens that is arranged between the passage restriction member and the sample, and that controls an orbit of the charged particle emitted from the sample, and a second lens that is arranged between the passage restriction member and the charged particle source, and that changes a focusing condition of the charged particle beam in accordance with a control condition of the first lens.

10 Claims, 16 Drawing Sheets

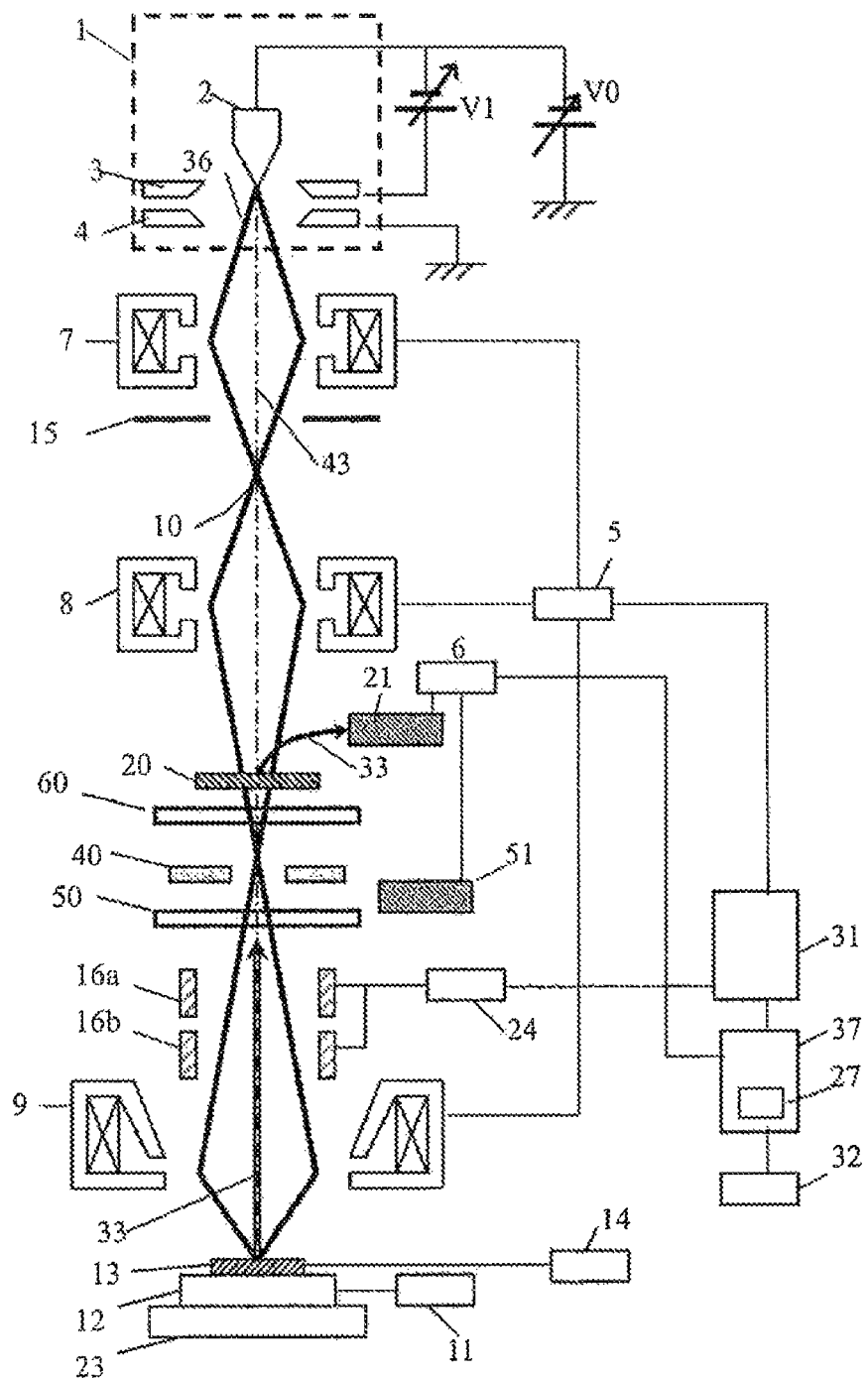
[Fig. 1]

[Fig. 2]
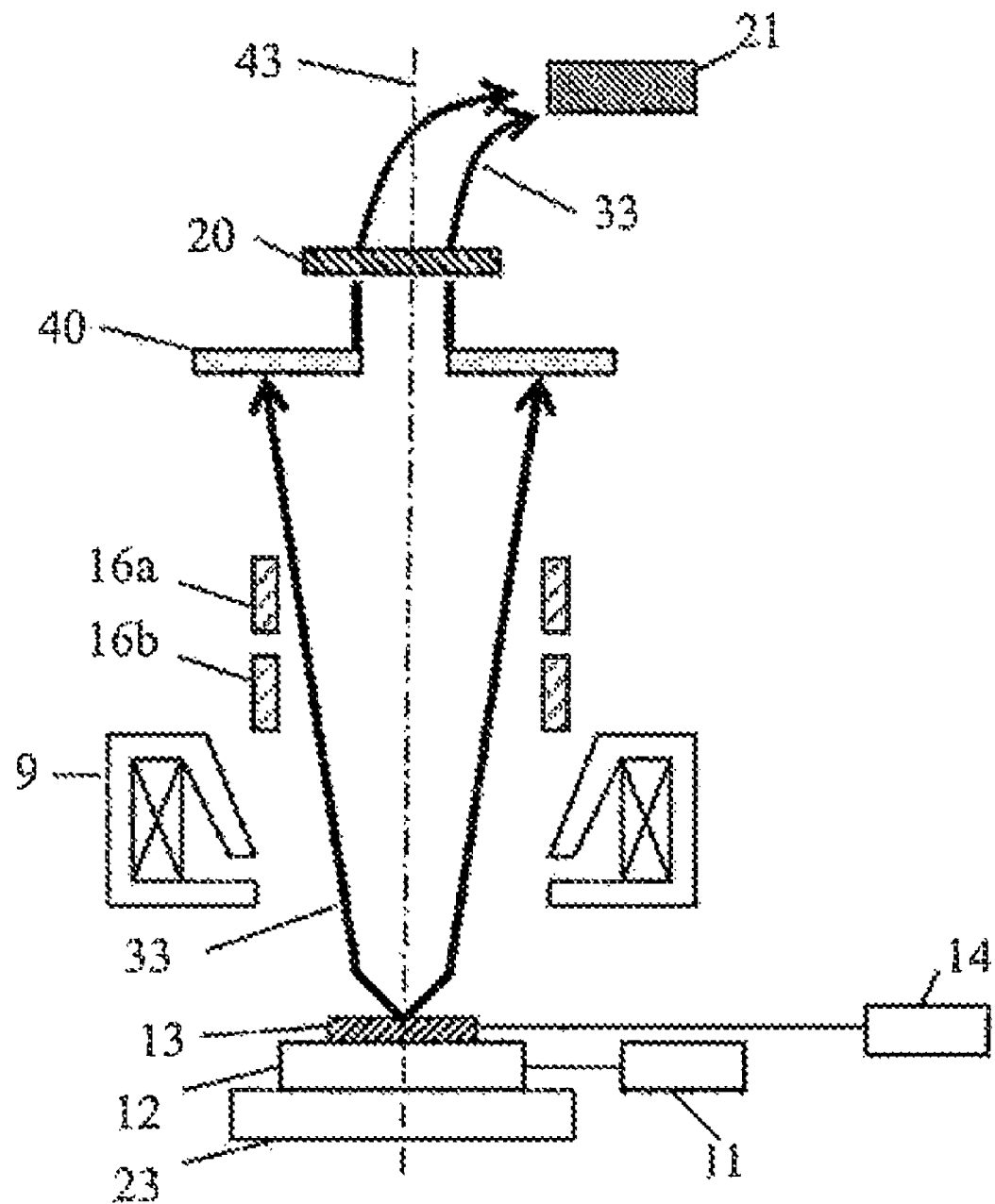

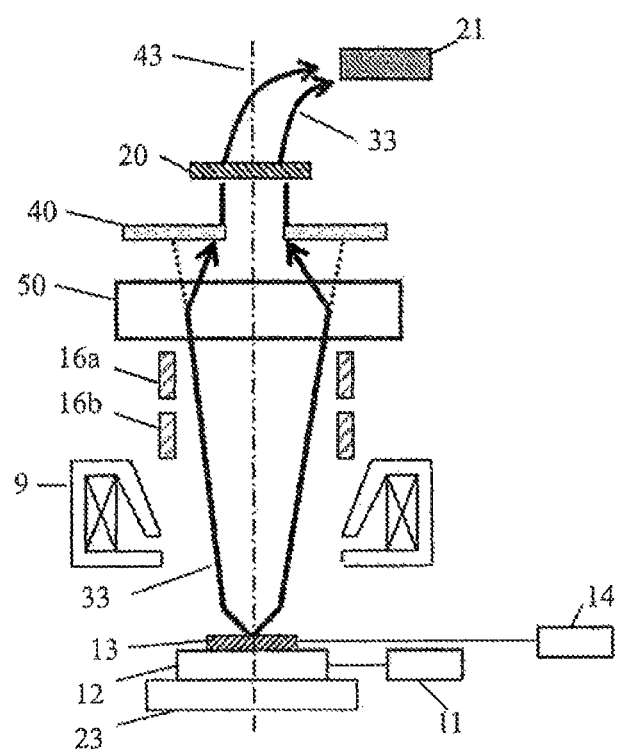
[Fig. 3]

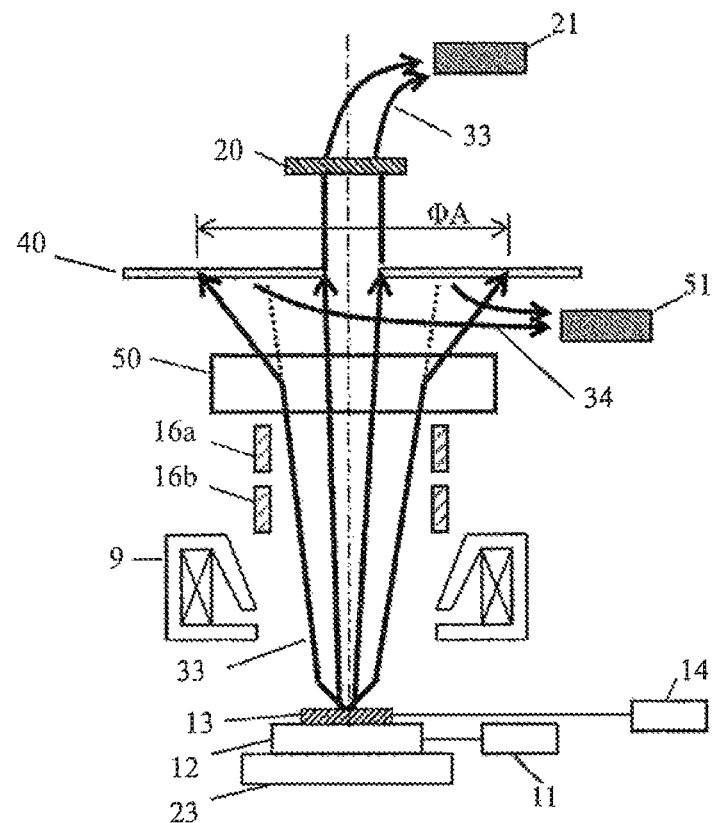
[Fig. 4]

[Fig. 5]
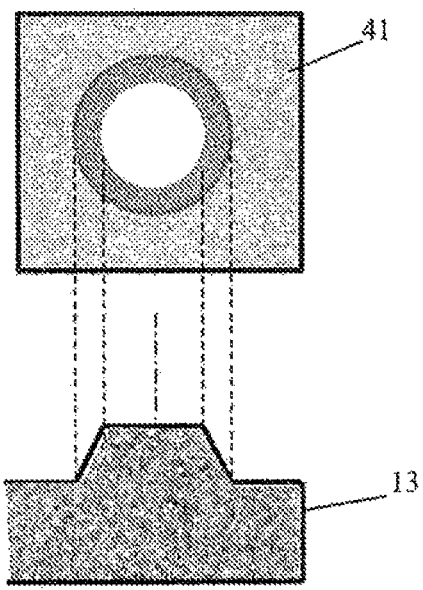
[Fig. 6]
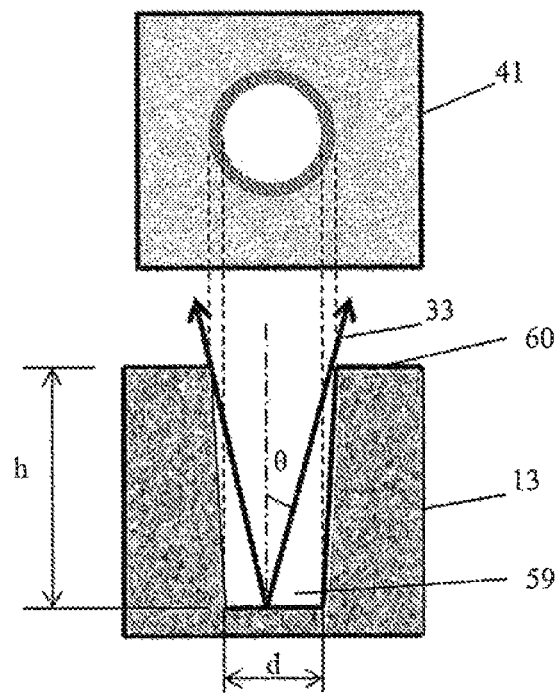

[Fig. 7]
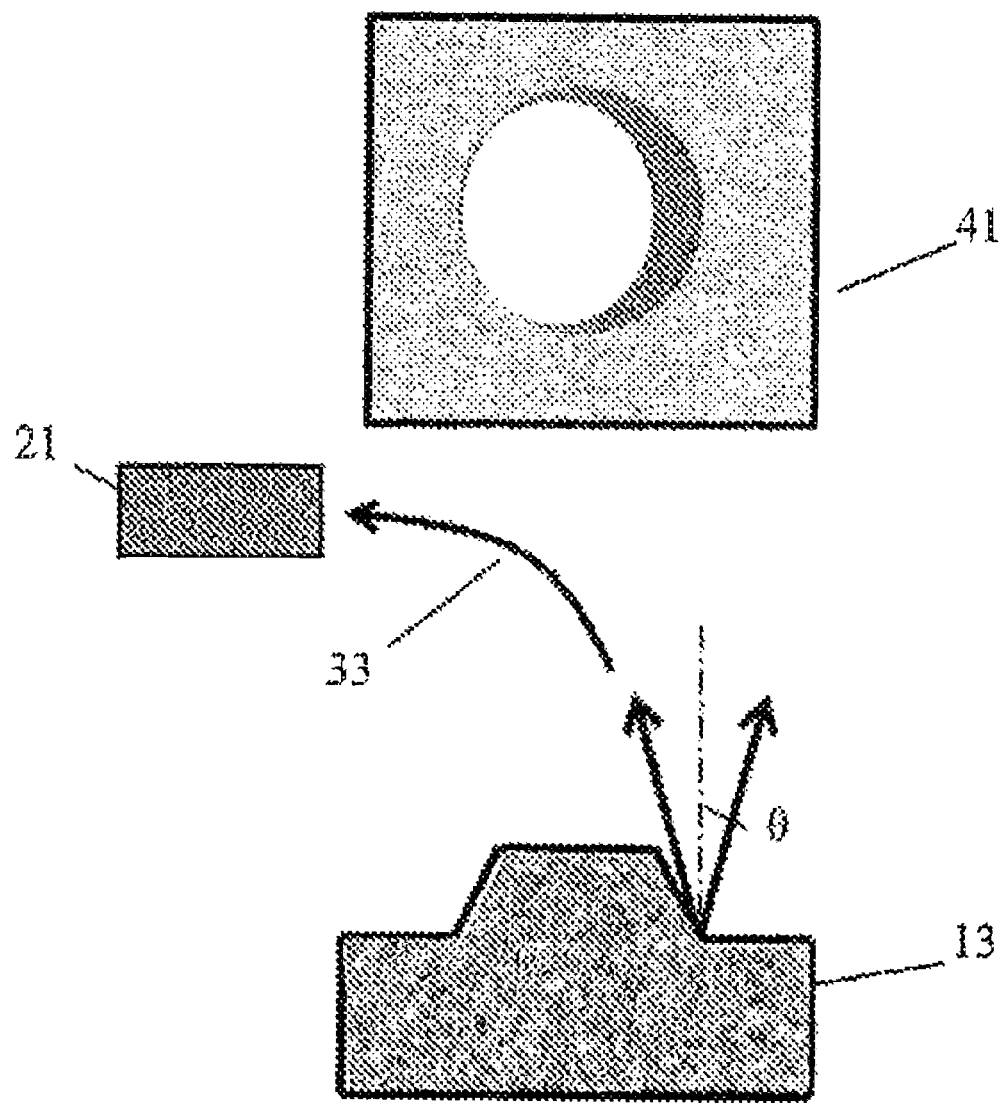

[Fig. 8]
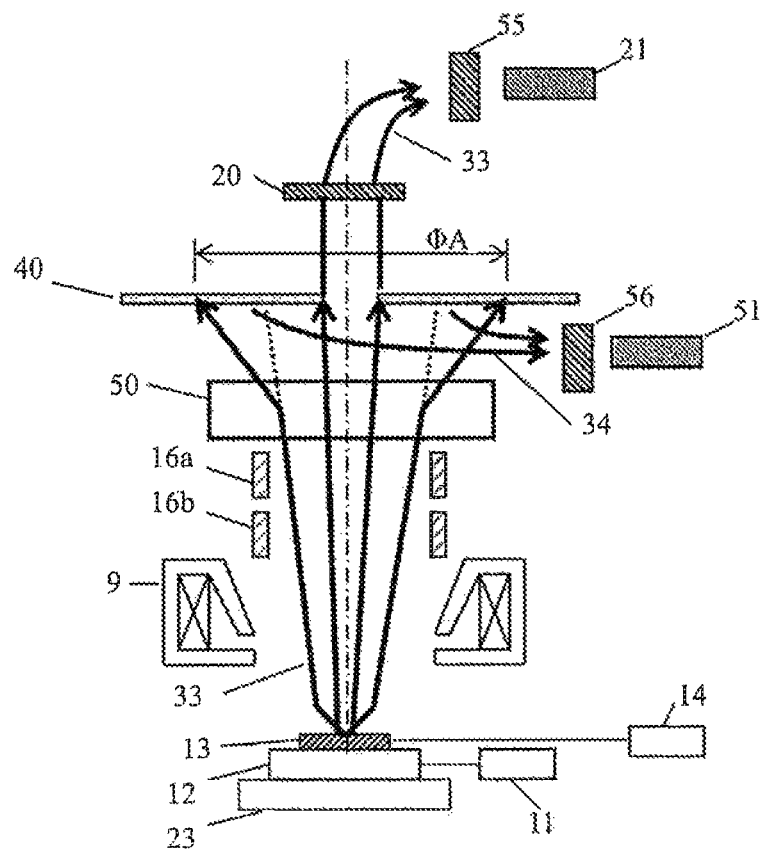
[Fig. 9]
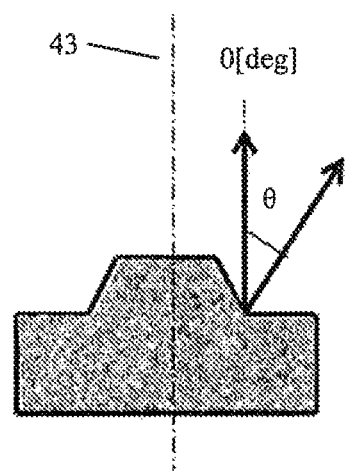

[Fig. 10]
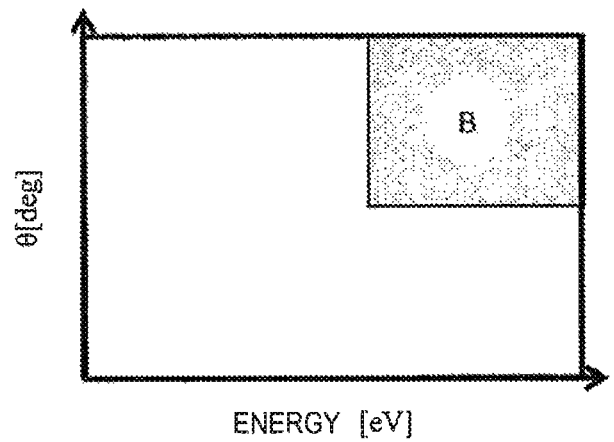
[Fig. 11]
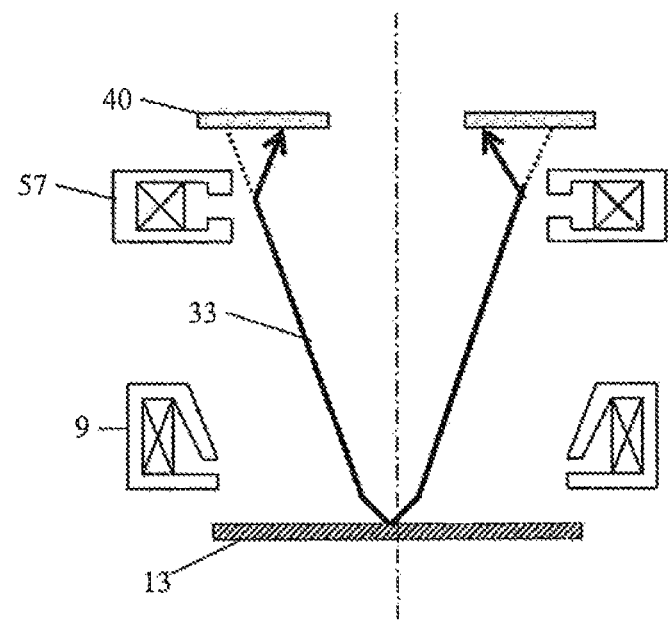

[Fig. 12]
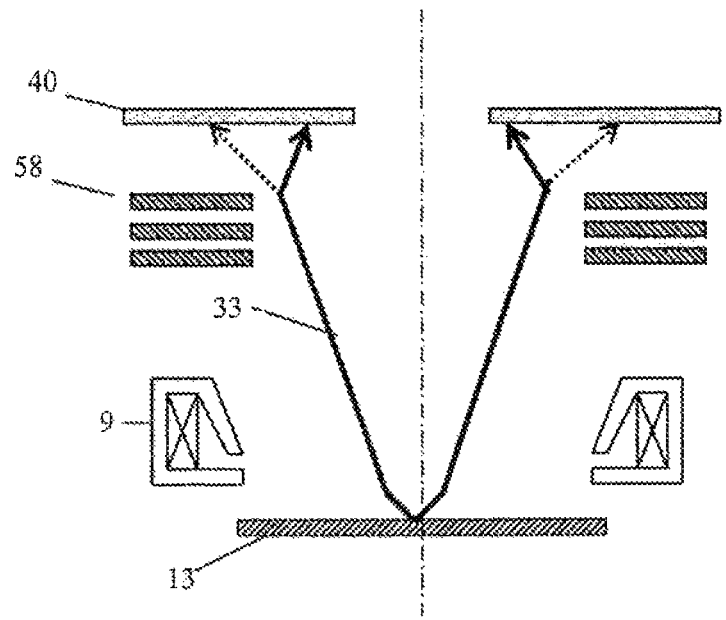
[Fig. 13]
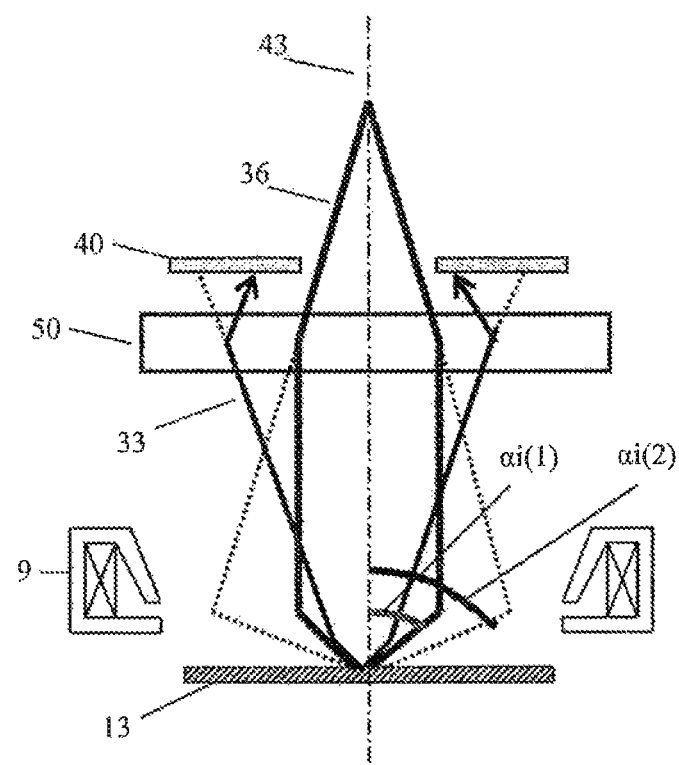

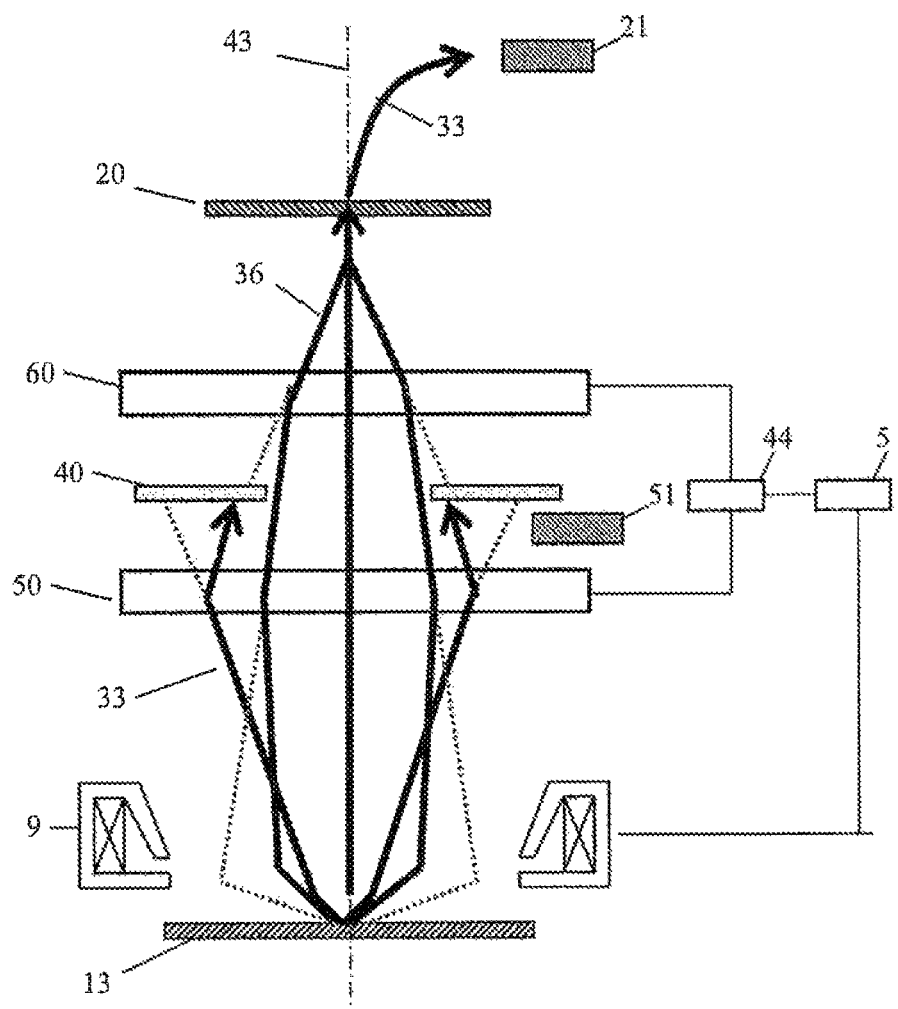
[Fig. 15]

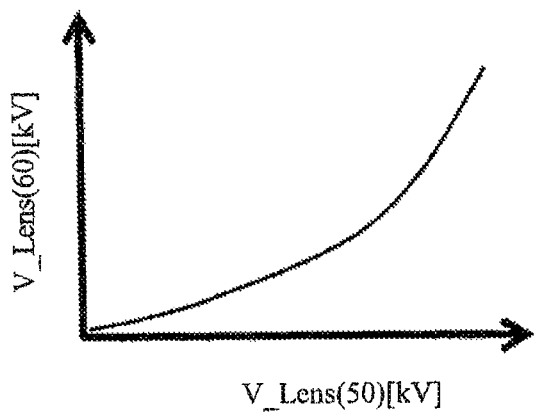
[Fig. 17]
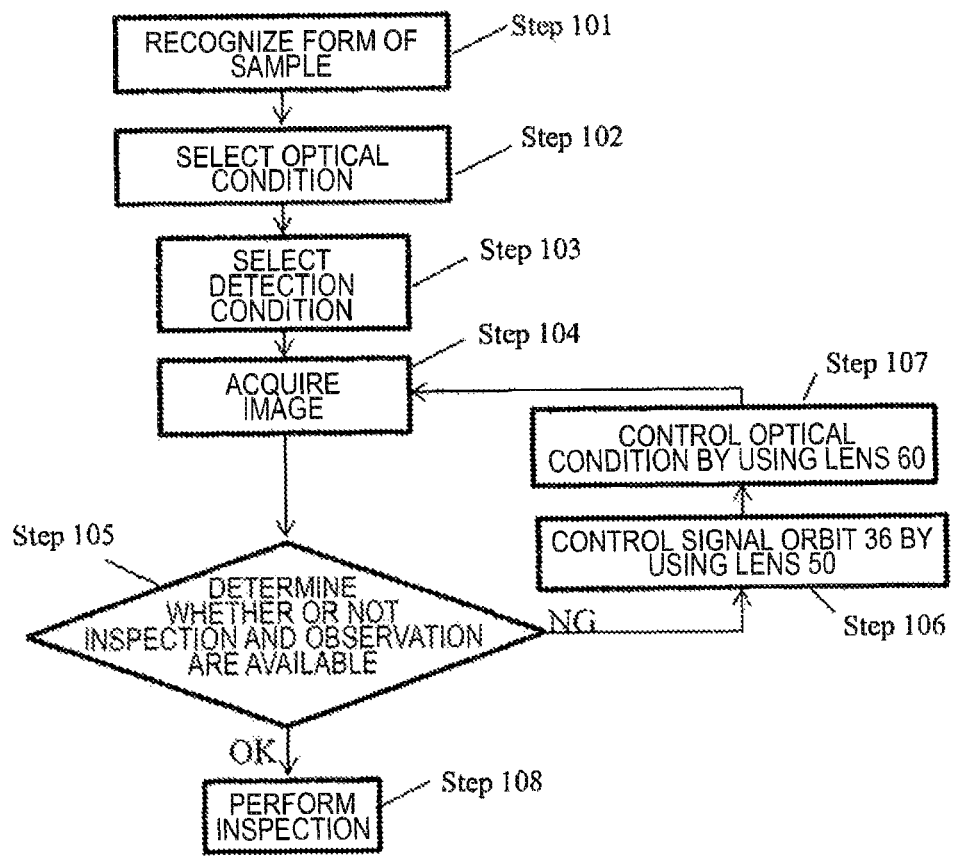

[Fig. 18]
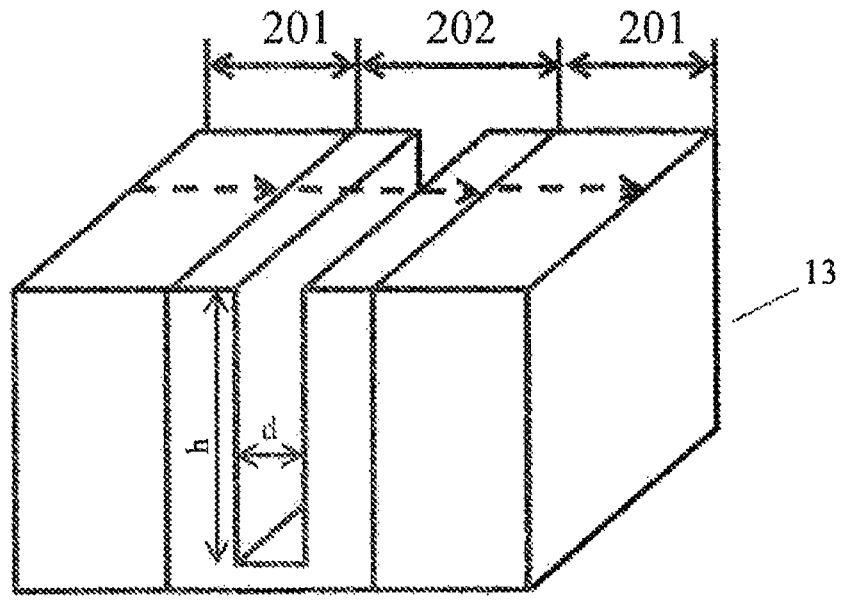
[Fig. 19]
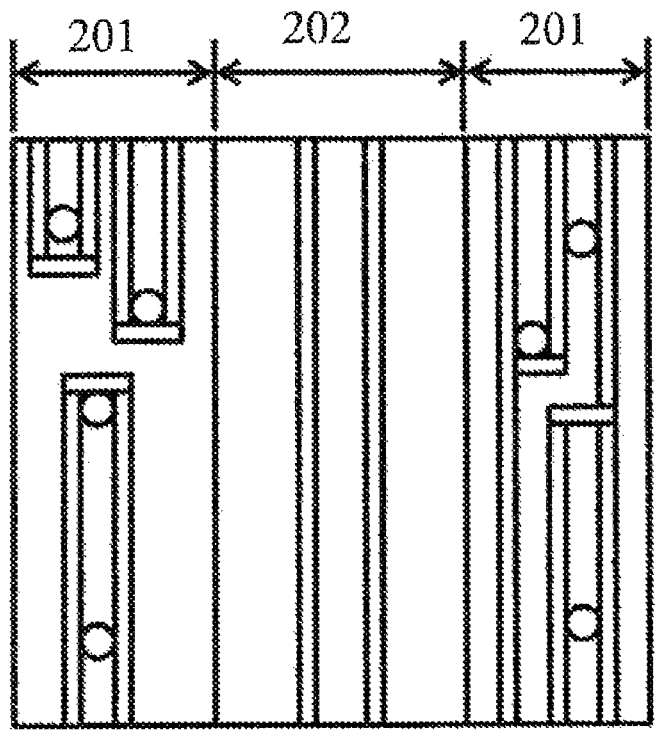

[Fig. 20]
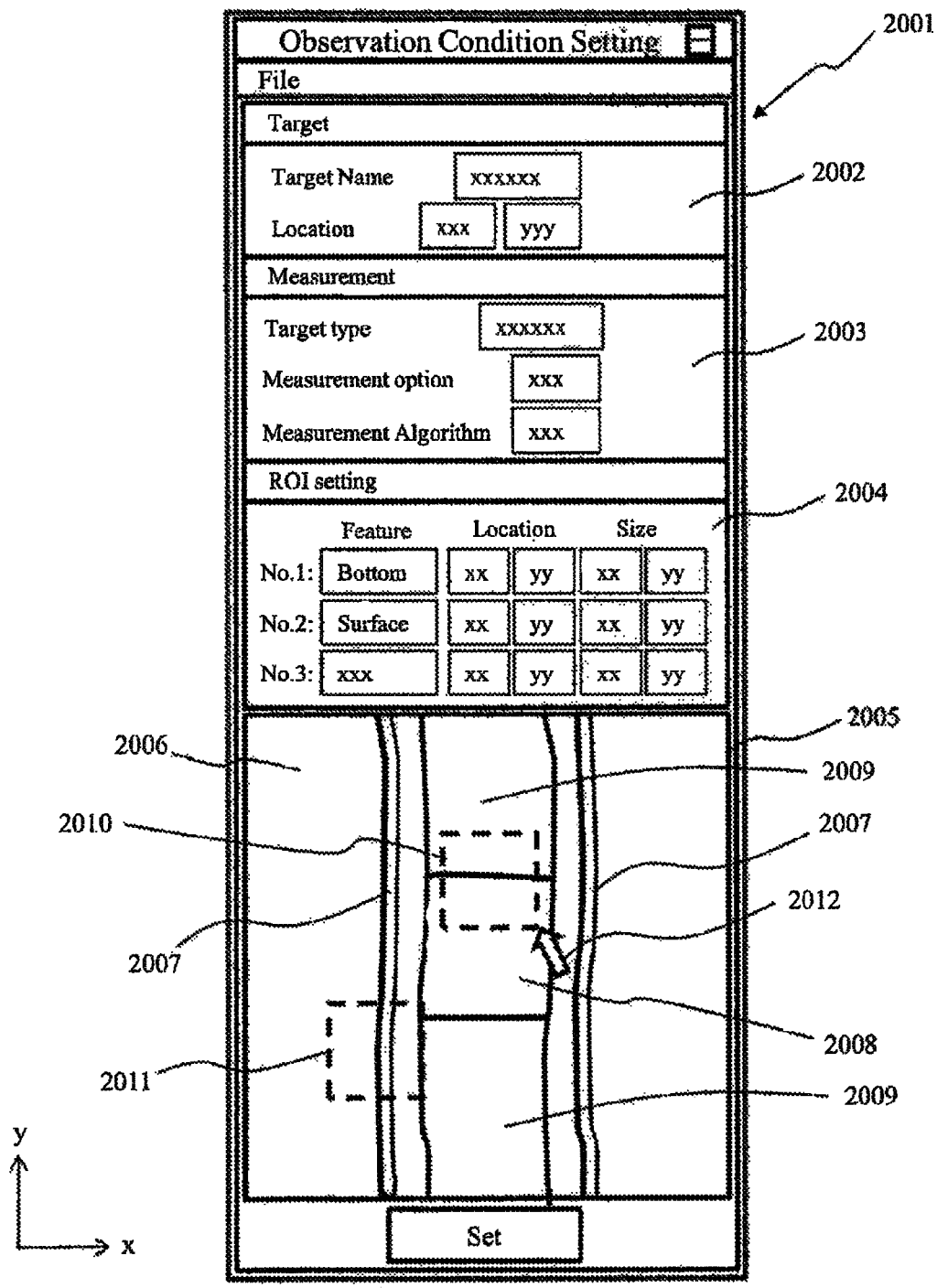

[Fig. 21]
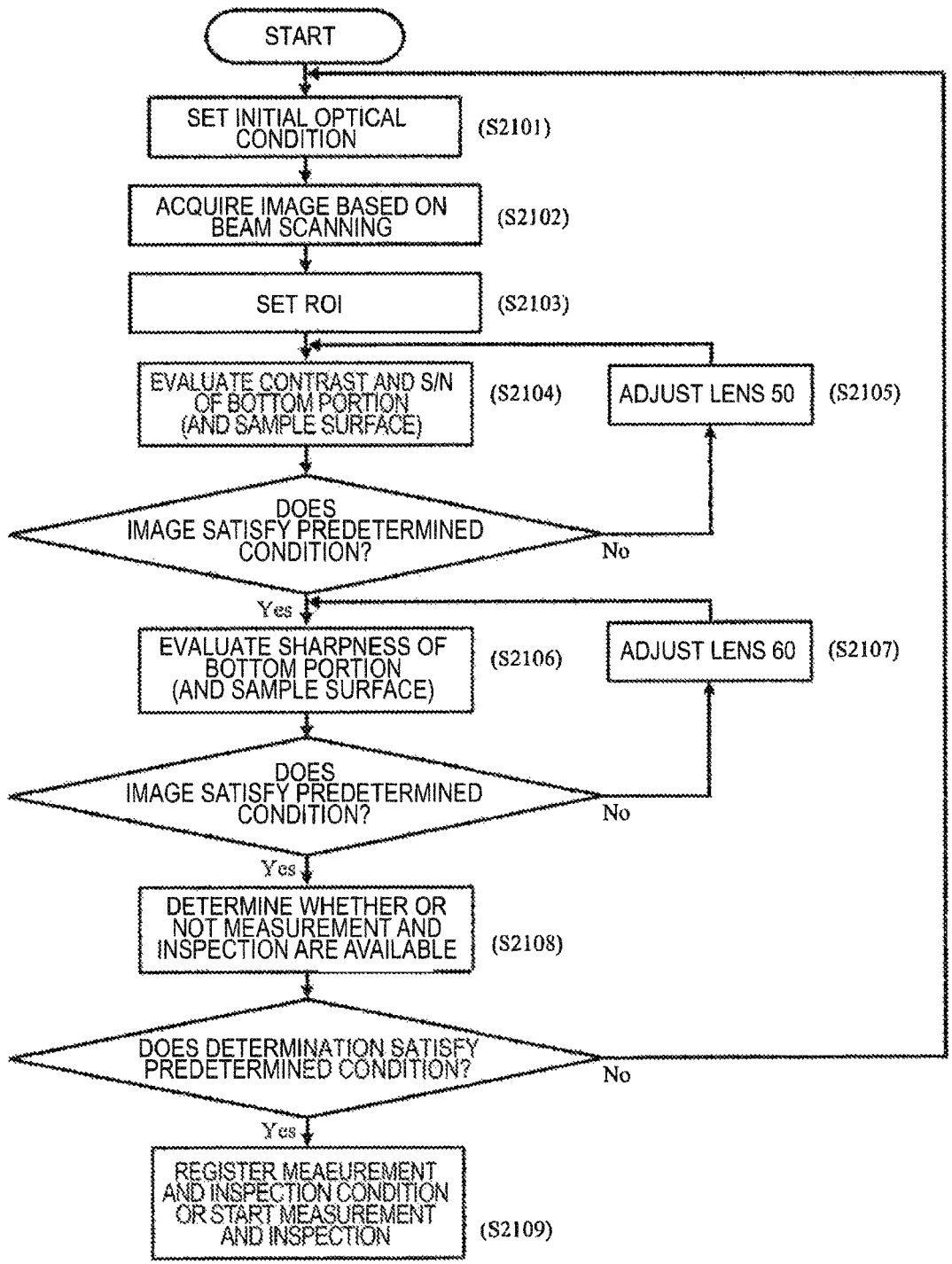

[Fig. 22]
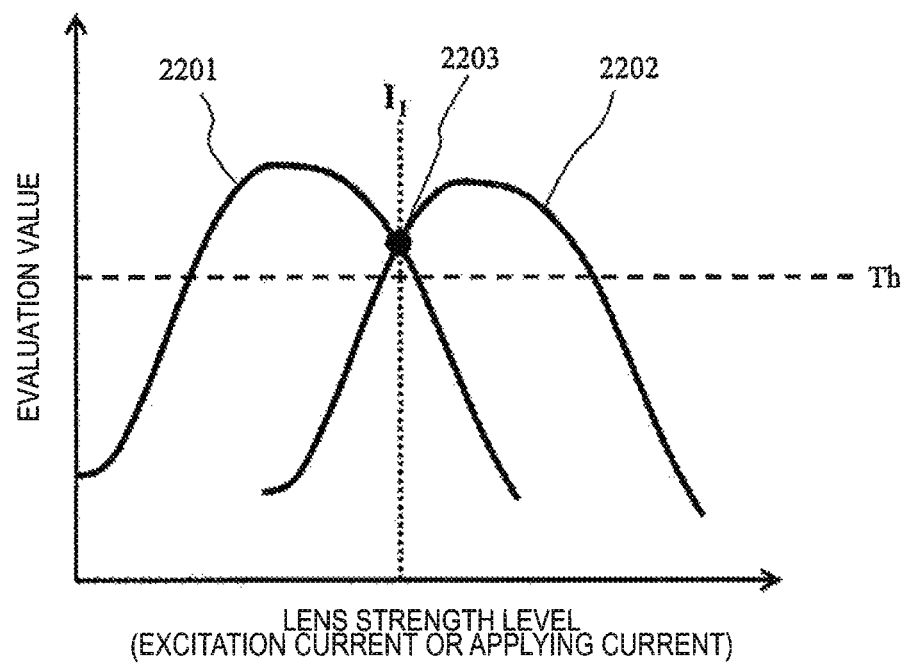

CHARGED PARTICLE BEAM APPARATUS

CLAIM PRIORITY

The present application claims priority from Japanese patent application JP 2015-129459 filed on Jun. 29, 2015, the content of which is hereby incorporated by reference into this application.

TECHNICAL FIELD

The present disclosure relates to a charged particle beam apparatus, and particularly relates to a charged particle beam apparatus which compatibly realizes optimized adjustment of a signal orbit from a sample and optimized adjustment of an emitting condition of a charged particle beam emitted from the sample.

BACKGROUND ART

A scanning electron microscope (SEM) which is one of the charged particle beam apparatuses scans a micro object with a finely focused electron beam. In this manner, the device emits a secondary electron from the sample, and observes, inspects, or measures the micro object, based on the secondary electron.

PTLS 1 to 3 disclose a method of controlling a lens which is one type of an optical element of an SEM. PTL 1 discloses that a wider aperture angle of a beam to be emitted to the sample provides a high-resolution image to be formed based on the beam emitting, and discloses a control method of controlling a voltage to be applied to the sample so that a predetermined aperture angle $\alpha$ is obtained in order to emit the beam at a large aperture angle. PTL 2 discloses an SEM including a lens for focusing the beam so that an orbit of an electron to be emitted toward the outside of a detector within the secondary electrons emitted from the sample is oriented to the detector. In addition, PTL 3 discloses an SEM including a lens for optimally adjusting an orbit which is incident on an energy filter arranged between the detector and the sample.

CITATION LIST

Patent Literature

PTL 1: Japanese Patent No. 5553489 (corresponding to U.S. Pat. No. 7,888,640)
PTL 2: Japanese Patent No. 5478683 (corresponding to U.S. Pat. No. 8,759,761)
PTL 3: Japanese Patent No. 5663412 (corresponding to U.S. Pat. No. 8,946,649)

SUMMARY OF INVENTION

Technical Problem

A charged particle beam to be emitted to a sample is emitted to the sample after being focused by an objective lens. In this case, a high-resolution image can be obtained by focusing the charged particle beam on a sample surface. In a case where a bottom of a deep hole or a deep groove is measured, it is desirable to focus the charged particle beam on the bottom of the deep hole or the deep groove instead of the sample surface. On the other hand, some charged particles emitted from the bottom of the deep hole or the deep groove are emitted in various directions. The charged particles emitted in a direction opposite to an emitting direction of the charged particle beam can escape from the deep hole or the deep groove. However, the charged particles emitted in other directions collide with a side wall of the deep hole or the deep groove, thereby going astray. That is, compared to the charged particles emitted from the sample surface, the charged particles emitted from the bottom of the hole are inefficiently detected due to the presence of the charged particles colliding with the side wall.

In this assumption, when an image is obtained from a viewing region including the deep hole or the deep groove, if the charged particles emitted at a specific emitting angle can be selectively detected, it is possible to generate the image which relatively emphasizes the bottom of the deep hole or the deep groove.

Depending on a diameter (width) of the deep hole or the deep groove, a range of the emitting angle suitable for the detection varies. Accordingly, it is desirable to selectively guide an electron emitted in a specific direction to a detector by using a lens for focusing a secondary electron as disclosed in PTLS 2 and 3. However, on the other hand, a change in this focusing condition also changes a focusing condition of the charged particle beam emitted to the sample. Even if an aperture angle is optimized in order to observe the bottom portion, a lens condition is adjusted, thereby causing a possibility that the aperture angle may be changed. Each technology disclosed in PTLS 1 to 3 does not intend to compatibly provide optimized adjustment of the focusing condition of the charged particle beam and optimized adjustment of an orbit of the charged particle emitted from the sample.

Hereinafter, a charged particle beam apparatus will be described which aims to compatibly provide optimized adjustment of a focusing condition of a charged particle beam focused on a sample and optimized adjustment of an orbit of a charged particle emitted from the sample.

Solution to Problem

As an aspect for achieving the above-described object, there is provided a charged particle beam apparatus including a focusing lens for focusing a charged particle beam emitted from a charged particle source and an objective lens for emitting the charged particle beam focused by the focusing lens to a sample. The charged particle beam apparatus includes a passage restriction member that partially restricts passage of the charged particle emitted from the sample, a first lens that is arranged between the passage restriction member and the sample, and that controls an orbit of the charged particle emitted from the sample, and a second lens that is arranged between the passage restriction member and the charged particle source, and that changes a focusing condition of the charged particle beam in accordance with a control condition of the first lens.

As another aspect for further achieving the above-described object, there is provided a charged particle beam apparatus including a focusing lens for focusing a charged particle beam emitted from a charged particle source and an objective lens for emitting the charged particle beam focused by the focusing lens to a sample. The charged particle beam apparatus includes a passage restriction member that partially restricts passage of the charged particle emitted from the sample, a first lens that is arranged between the passage restriction member and the sample, a second lens that is arranged between the passage restriction member and the charged particle source, a detector that detects the charged particle obtained based on the charged particle beam emitted to the sample, and a control device that controls the first lens and the second lens. The control device controls the first lens so that at least one portion of an image generated based on an output of the detector is brought into a predetermined state, and while maintaining the control of the first lens, the control device controls the second lens so that at least one portion of the image is brought into a predetermined state.

Advantageous Effects of Invention

According to the above-described configurations, it is possible to compatibly provide optimized setting of a focusing condition of a charged particle beam focused on a sample and optimized adjustment of an orbit of a charged particle emitted from the sample.

BRIEF DESCRIPTION OF DRAWINGS

FIG. 1 is a view schematically illustrating a charged particle beam apparatus.

FIG. 2 is a view for describing an orbit of an electron emitted from a sample.

FIG. 3 is a view for describing an orbit of an electron when a lens for adjusting the orbit of the electron emitted from the sample is operated.

FIG. 4 is a view for describing an orbit of an electron when a lens for adjusting the orbit of the electron emitted from the sample is operated.

FIG. 5 is a view illustrating an example of a convex pattern and an SEM image thereof.

FIG. 6 is a view for describing an orbit of an electron emitted from a bottom portion of a hole pattern.

FIG. 7 is a view for describing an orbit of the electron emitted from the sample which reaches a detector.

FIG. 8 is a view for describing an orbit of an electron when a lens for adjusting the orbit of the electron emitted from the sample is operated.

FIG. 9 is a view illustrating an orbit (definition of an emitting angle) of the electron emitted from the sample.

FIG. 10 is a view illustrating a relationship between energy and an emitting angle of an information signal.

FIG. 11 is a view illustrating an example in which an electromagnetic field-type control lens is employed as the lens for adjusting the orbit of the electron emitted from the sample.

FIG. 12 is a view illustrating an example in which an electrostatic-type control lens is employed as the lens for adjusting the orbit of the electron emitted from the sample.

FIG. 13 is a view illustrating a relationship between an aperture angle of an electron beam emitted to a sample and an orbit of an electron emitted from the sample.

FIG. 15 is a view for describing an orbit of an electron beam which is changed by two control lenses.

FIG. 16 is a view illustrating a relationship between lens strength levels of the two control lenses.

FIG. 17 is a flowchart illustrating an adjustment process of the two control lenses.

FIG. 18 is a view illustrating an example of a sample in which a three-dimensional structure and a planar portion are mixed with each other.

FIG. 19 is a view illustrating an example of an SEM image of the sample including the three-dimensional structure.

FIG. 20 is a view illustrating an example of a GUI screen for setting a device condition of a scanning electron microscope.

FIG. 21 is a flowchart illustrating an adjustment process of the two control lenses.

FIG. 22 is a view illustrating a relationship between the lens strength level and a focus evaluation value.

DESCRIPTION OF EMBODIMENTS

Figure 14A:
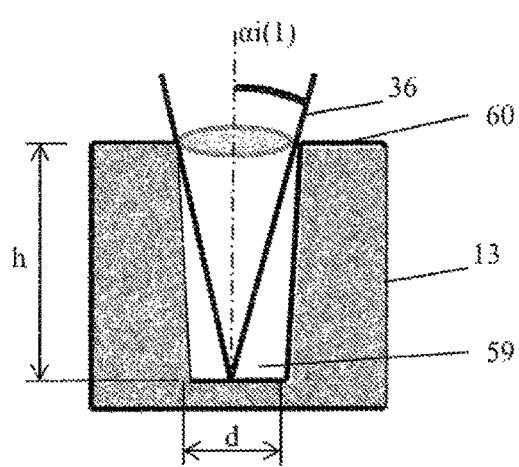
FIGS. 14A and 14B are views illustrating a relationship between the aperture angle and a focal position of the electron beam.

Resolution of an image formed based on detection of a secondary electron is one of important index values for evaluating performance of an electron microscope. As the resolution becomes higher, the electron microscope can realize more accurate measurement or inspection. A high-resolution image can be formed by optimally locating a focal position of an electron beam on a sample surface. In addition, as an aperture angle of the beam becomes larger, the higher-resolution image is obtained. Accordingly, it is desirable to shorten a focal distance (distance between a main surface of an objective lens and a sample, also referred to as a working distance) as much as possible. The aperture angle means an angle of the electron beam when the objective lens is viewed from the sample, and is a relative angle between an ideal optical axis of the electron beam and the beam focused toward the sample.

As described above, in order to acquire the high-resolution image, it is desirable to focus the beam with a large aperture angle. In contrast, in a case where a bottom portion of a deep hole or a deep groove is observed, the beam having the large aperture angle cannot be optimally focused on the bottom portion of the deep hole.

Furthermore, in some cases, a certain electron emitted from the bottom portion of the deep hole or the deep groove collides with a side wall of the deep hole. In a case where a region including the deep hole is scanned using the beam, the beam includes the electron emitted from the bottom of the deep hole and the electron emitted from other portions (for example, a sample surface surrounding the deep hole). Under these circumstances, in order to form an image which emphasizes the bottom portion of the deep hole, it is desirable to selectively detect the electron emitted using an angular range of $\theta = \tan^{-1}(d/2h)$ with respect to a perpendicular line of the sample surface, for example, in a case where a diameter of the deep hole is set to d and a depth of the deep hole is set to h. In theory, the electron emitted using this angular range does not collide with the side wall of the deep hole, and is the electron emitted to the sample surface. On the other hand, the electron emitted from the sample surface includes the electron emitted using the above-described angular range and the electron emitted using other angles. Accordingly, it is possible to minimize a detection amount of the electron emitted from the sample surface by selectively detecting the electron in the above-described angular range. Therefore, compared to a case where the electron is not selectively detected, it is possible to form the image which relatively emphasizes the bottom portion of the deep hole.

In addition, an orbit of the electron emitted from the sample varies depending on a focusing condition of the objective lens. Accordingly, it is desirable to dispose an adjustment element for optimally adjusting the orbit of the electron emitted from the sample. On the other hand, if the orbit is adjusted using this adjustment element, the electron beam is also affected. Consequently, in some cases, the focusing condition of the lens is unavoidably changed.

Hereinafter, a charged particle beam apparatus will be described which can compatibly provide optimized setting of the focusing condition of a charged particle beam such as the electron beam and optimized adjustment of the orbit of a charged particle emitted from the sample.

Hereinafter, as an aspect for compatibly realizing both of these, the charged particle beam apparatus will be described which includes a first lens for controlling the orbit of a signal electron (electron emitted from the sample) and a second lens for adjusting the focusing condition of the charged particle beam in accordance with a change in a lens condition of the first lens.

The charged particle beam apparatus includes a focused ion beam apparatus in addition to SEM. In addition, an apparatus in which SEM is specifically employed for a specific purpose includes a length measuring electron microscope (critical dimension-SEM: CD-SEM) or a reviewing electron microscope (Review SEM) which observes and analyzes details of defects, foreign substances, or patterns having an abnormal length measurement value which are obtained by an inspection device located on an upstream side.

In a case where measurement or inspection is performed using these apparatuses, it is necessary to efficiently detect an information signal output from the sample by using a detector. If the information signal increases, image quality is improved, thereby leading to improved throughput. On the other hand, since a user desires to extract information on the user's inspection target, separately from others, it is eventually necessary to perform observation or inspection by reinforcing a function to discriminate the information signal.

As means for extracting the information required for the inspection in this way, there is provided an energy filter. The energy filter is a device through which a charged particle holding specific energy in the charged particles emitted from the sample is selectively allowed to pass. However, some inspection targets are present which hold the information depending on not only the discrimination of the energy but also an angle of the charged particle emitted from the sample. Accordingly, in some cases, the information is effectively used for the measurement or the inspection.

FIG. 6 illustrates an image 41 of a deep hole and a sectional structure of the deep hole. The deep hole having a bottom portion 59 is disposed in a sample 13. The image 41 is obtained in such a way that a region including the deep hole and a sample surface 60 is scanned using the electron beam. In the electrons emitted from the bottom portion 59, the electron passing through an orbit close to a perpendicular line with respect to the sample surface by using a certain angle (θ in the drawing) (electron emitted in a first angular range) can escape from the deep hole. However, the electron emitted at a larger angle than θ (electron emitted in a second angular range) collides with a side wall of the deep hole, and cannot escape from the deep hole. On the other hand, the electron emitted from the sample surface 60 does not collide with other members, and is guided upward, even if the electron is emitted in the second angular range. Accordingly, in order to emphasize the bottom portion 59 with respect to the sample surface 60, it is desirable to selectively detect the electron emitted in the first angular range.

FIGS. 5 and 7 illustrate an image example of the sample 13 having a convex pattern formed thereon. FIG. 5 illustrates the image example obtained by detecting the electron emitted from the sample without any angular limitation. Since there is no angular limitation, the amount of the detected electron increases. However, in a case of a two-dimensional image such as the image 41, it is difficult to determine whether a central pattern is a convex pattern or a concave pattern. On the other hand, in the image 41 illustrated in FIG. 7, a detector 21 selectively detects an electron 33 emitted in a specific direction. The image obtained based on the detection in this way is a bird's-eye view image (perspective image). Therefore, it is possible to easily determine whether the pattern is concave or convex.

Hereinafter, referring to the drawings, the charged particle beam apparatus will be described which can very efficiently and selectively detect the electron emitted in the specific direction or the electron generated by the electron emitted in the specific direction colliding with other members, while optimally setting an emitting condition of the electron beam emitted to the sample.

FIG. 1 is a view schematically illustrating an SEM which is an example of the charged particle beam apparatus. Hereinafter, SEM will be described as an example. However, without being limited thereto, an embodiment introduced herein is also applicable to other charged particle beam apparatuses.

An electron source 1 for emitting the electron beam (primary charged particle beam 36) includes a negative electrode 2, an extraction electrode 3 for extracting the electron from the negative electrode 2, and an acceleration electrode 4 for accelerating the electron extracted by the extraction electrode 3 toward the sample 13. An acceleration voltage V0 is applied to the negative electrode 2. A potential difference between the negative electrode 2 and the acceleration electrode 4 serving as a ground potential causes the primary charged particle beam 36 to hold acceleration energy V0. The primary charged particle beam 36 emitted from the electron source 1 is focused by a focusing lens 7, a focusing lens 8, and an objective lens 9, and is emitted to the sample 13. In addition, a diaphragm 15 through which a paraxial electron beam passing through an ideal optical axis 43 of the electron beam is selectively allowed to pass is disposed between the focusing lens 7 and the focusing lens 8. The respective lenses can control a focusing condition thereof by adjusting an excitation current (applied voltage in a case of an electrostatic lens) to be supplied from a lens power source 5.

The sample 13 is arranged on a sample stage 12, and the sample stage 12 is supported by a sample stage driving mechanism 23 which moves the sample stage 12 in at least two directions perpendicular to the ideal optical axis 43 of the electron beam. A laser interferometer 11 is disposed in order to specify a position of the sample stage 12. Furthermore, a negative voltage applying power source 14 of a for applying a negative voltage to the sample 13 is disposed. It is possible to control energy of the primary charged particle beam 36 which is needed to reach the sample by adjusting the applying voltage of the negative voltage applying power source 14.

Deflectors 16a and 16b are disposed in order to one-dimensionally or two-dimensionally scan the sample 13 by using the primary charged particle beam 36, and can generate a signal waveform (line profile) or a two-dimensional image by synchronizing a scanning signal supplied from a scanning signal generator 24 for controlling the deflectors 16a and 16b with an output signal of a detector (to be described later).

Two detectors 21 and 51 are disposed in the charged particle beam apparatus illustrated in FIG. 1, and can detect a secondary electron (SE) emitted from the sample 13, a backscattered electron (BSE), or a new secondary electron (tertiary electron) generated by the secondary electron colliding with a control plate 40 including a passage opening of the electron beam. The charged particle beam apparatus illustrated in FIG. 1 employs the detector 51 serving as an indirect detector which indirectly detects the electron emitted from the sample by detecting the tertiary electron generated by the secondary electron colliding with the control plate 40, and the detector 21 serving as a direct detector which directly detects the electron emitted from the sample 13. However, without being limited to the combination, a type of the detectors may be changed, if necessary. A crossed electromagnetic field generator 20 can deflect the electron emitted from the sample 13 toward the detector 21 without deflecting the primary charged particle beam 36.

An output of the detectors 21 and 51 is amplified by an amplifier 6, and is supplied to an image processing unit 37. The image processing unit 37 integrates an amplified signal, thereby generating the signal waveform or the two-dimensional image and causing a storage unit 27 to store the signals. In addition, an image display device 32 can display the two-dimensional image.

Each configuration element of the charged particle beam apparatus is controlled by a control unit 31 (control device) so as to particularly perform controlling (to be described later).

Furthermore, the charged particle beam apparatus illustrated in FIG. 1 includes a lens 50 (first lens) and a lens 60 (second lens) in addition to the focusing lenses 7 and 8 or the objective lens 9. Hereinafter, a specific example of adjusting an optical condition by using these lenses will be described.

Figure 14B:
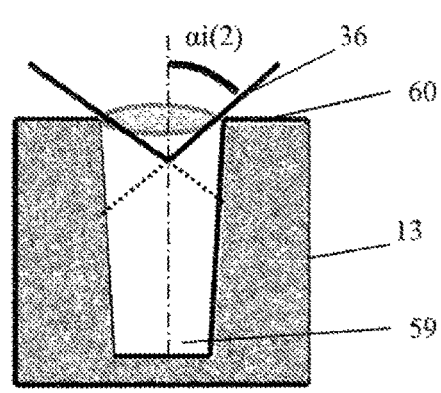

In a case where a bottom portion of a three-dimensional structure 59 as illustrated in FIG. 6 is very accurately measured or inspected, it is necessary to focus the primary charged particle beam 36 on the bottom portion 59. More specifically, the beam is not focused by holding a large aperture angle as illustrated in FIG. 14($b$). Alternatively, it is desirable to arrange the beam so as not to interfere with the sample before the beam reaches the bottom portion 59 by setting the aperture angle to be a relatively acute angle as illustrated in FIG. 14($a$). As illustrated in FIG. 14($a$), in a case of measuring or observing the bottom portion 59 of a hole in which a depth is set to h and a diameter is set to d, if an aperture angle i (1) of the beam=$\tan^{-1}$ (d/2 h) can be satisfied, the beam can be focused on the bottom portion 59 while poor resolution is prevented (while the aperture angle is prevented from becoming an acute angle).

In the present embodiment, an example will be described in which an aperture angle is adjusted to $\alpha i$ (1) in a case where the aperture angle of the beam adjusted by autofocus is $\alpha i$ (2) as illustrated in FIG. 14($b$). In the present embodiment, as illustrated in FIG. 13, the aperture angle is adjusted by using the lens 50. On the other hand, a focusing operation of the lens 50 influences not only the primary charged particle beam 36 but also an information signal 33 (electron emitted from the sample). The lens 50 focuses not only the primary charged particle beam 36 but also the information signal 33.

On the other hand, in an initial state, if the lens 50 is controlled so as to diverge the primary charged particle beam 36, the information signal 33 is also diverged as illustrated in FIG. 4.

In a case where the sample as illustrated in FIG. 6 is observed and inspected, a user desires to discriminate and observe the information signal of a hole bottom 59 as described above. In addition, the user also desires to simultaneously observe and inspect the hole bottom 59 and the surface 60. In this case, in order to efficiently detect a signal from the hole bottom 59, it is necessary to emit the primary charged particle beam 36 to the hole bottom 59. In this case, if the beam diameter of the primary charged particle beam 36 is the same as the hole diameter d, the beam does not blur in a portion of the height h. That is, the resolution in the depth direction represents h. Hereinafter, the resolution in the depth direction is referred to as a "focus depth". On the other hand, under a condition that the aperture angle $\alpha i$ is large as illustrated in FIG. 14($b$), a primary charged particle 36 does not reach the hole bottom, and the focus depth is insufficient. That is, this optical condition is not suitable for the observation of the sample having a deep hole.

FIG. 3 is a view illustrating an example in which the information signal 33 is focused by using the lens 50. The orbit of the information signal 33 emitted from the sample 13 is controlled by the lens 50 which performs a focusing operation. For example, in a case where the electrode 40 which restricts the orbit of the information signal 33 is present on the optical axis 43, the strength level of the lens 50 is controlled so that the information signal 33 passes through the hole diameter. The information signal 33 passing through the hole is guided to and detected by the detector 21. In this case, a convergence strength level of the lens 50 depends on an emitting angle of the information signal 33 to be detected by the detector 21. If a user desires to obtain extremely clear information, the user controls the strength level of the lens 50 so as to very efficiently detect a signal emitted in a specific direction. That is, the strength level of the lens 50 is controlled in accordance with the information signal 33 to be detected by the detector 21.

FIG. 4 is a view illustrating an orbit of the electron when the lens condition is controlled so as to diverge the orbit of the information signal. The orbit of the information signal 33 emitted from the sample 13 is controlled by the lens 50 which performs a diverging operation. In some cases, the operation of the lens 50 for controlling the primary charged particle 36 is not optimal for the information signal 33. For example, in some cases, the focusing operation on the information signal 33 is insufficiently performed, or reversely, the focusing operation is excessively performed. Accordingly, it is necessary to adopt a configuration which can respectively control the primary charged particle beam 36 and the information signal 33 by disposing the lens 60 in addition to the lens 50.

In the present embodiment, the charged particle beam apparatus will be mainly described which can selectively detect the electron emitted at a specific angle in the electrons emitted from the sample, while the electron is focused on the bottom portion of the deep hole or the deep groove. As described above, the lens for focusing the electron changes not only the electron beam emitted to the sample but also the orbit of the electron emitted from the sample. Even when the electron beam is focused on the hole bottom, if the focusing condition of the lens at that time does not match the focusing condition for selectively detecting the electron at a desired sample emitting angle, it is difficult to very accurately measure or inspect the hole bottom. In the present embodiment, the charged particle beam apparatus will be mainly described which can very accurately measure or inspect the bottom portion of the deep hole or the deep groove.

Herein, a control method of the information signal 33 will be described. As illustrated in FIGS. 3 and 4, the strength level of the lens 50 can control the emitting angle of the information signal 33 which passes through a hole diameter of the control plate 40 (also referred to as an electrode, a diaphragm, or a passage restriction member which partially restricts passage of the electron emitted from the sample). That is, if an observation and inspection target or method is determined, a control method of the lens 50 is determined.

For example, a case will be described where the image of the sample as illustrated in FIG. 5 is obtained. In a case where a clear image is requested, the lens condition may be set so that the information signal 33 can pass through the control plate 40 as many as possible. The orbit is controlled so that the information signal 33 is focused and guided in a direction toward the detector 21 which detects the information signal 33 as illustrated in FIG. 3.

On the other hand, as described above, the image which emphasizes required information can be obtained by properly discriminating the information signal 33. For example, as illustrated in FIG. 6, the image which emphasizes the hole bottom can be obtained by selectively detecting the electron emitted in the angular range of $\theta=\tan^{-1}(d/2\,h)$ with respect to the perpendicular line of the sample surface in the information signal 33 emitted from the bottom portion 59 of the sample 13. However, in a case where the sample 13 is charged, the signal orbit receives the influence therefrom. Accordingly, there is a possibility that the information signal 33 to be captured may not reach the detector 21. For example, as illustrated in FIG. 2, if the orbit of the information signal 33 emitted from the sample 13 is calculated and determined in advance, the hole diameter of the control plate 40 is determined, and the required information signal 33 is discriminated and guided to the detector 21. Although not illustrated, if the information signal 33 receives the influence of the charged sample 13 and the signal orbit is way off calculation, the expected signal cannot be discriminated, and the image which emphasizes the desired information cannot be obtained.

In addition, as illustrated in FIG. 7, in a case where the image of the sample 13 having concave and convex portions is generated, it is desirable to discriminate the information signal 33. Compared to a case illustrated in FIG. 6, if the image is generated by discriminating the information signal 33 in a specific direction (for example, a direction $\pi-\theta$), the image which emphasizes an edge in the specific direction can be obtained. This feature can be used in determining whether the sample 13 is concave or convex depending on not only the feature of the information signal 33 but also the position or the direction of the detector 21. In the present embodiment, as illustrated in FIG. 9, $\theta$ is defined so that the same direction (perpendicular direction) as the optical axis 43 with respect to the sample 13 is set to zero degrees.

In general, it is understood that the different image quality can be obtained depending on not only the emitting direction $\theta$ of the information signal 33 from the sample 13 but also the energy. Accordingly, for example, as illustrated in FIG. 10, in a case where a user wants to form an image by using the information signal of required energy and an angular region B, in addition to the above-described method, it is effective to dispose an energy filter 55 or 56 in a front stage of the detector 21 as illustrated in FIG. 8. The information signal 33 passes through this energy filter, thereby causing the signal electron 33 whose energy is discriminated to reach the detector 21 or 51. A voltage is applied to the energy filter 55, thereby restricting the information signal 33 reaching the detector 21.

The lens 50 is configured to include a magnetic field-type lens as illustrated in FIG. 11 or an electrode-type lens as illustrated in FIG. 12. In a case of the electrode-type as illustrated in FIG. 12, an applying voltage can converge or diverge the information signal 33 (dashed arrow in the drawing). In order to observe and inspect the sample having a deep hole such as a three-dimensional structure, it is obviously necessary to control the aperture angle αi and the diameter of the primary charged particle 36, that is, the resolution. Furthermore, in order to efficiently detect the signal electron and obtain a clear image, it is necessary to increase the amount of the detected signal. As means for increasing the amount of the detected signal, one method is used which detects many information signals 33 by controlling the orbit of the information signal 33. Another method is to increase the amount of the charged particle beam to be emitted. Expression 1 is an arithmetic expression which represents a relationship between an emitting current Ip of the charged particle beam (electron beam) and the aperture angle αi on the sample.

$$Ip = B(d \cdot \pi \cdot \alpha i)^2 \qquad (1)$$

B: Brightness of Electron Source
d: Beam Diameter

In this manner, it is understood that in order to increase the emitting current Ip, it is effective to increase the aperture angle αi. B is a value determined depending on the electron source.

On the other hand, in order to deepen the focus depth, it is effective to decrease αi. Accordingly, it is understood that a trade-off relationship is present between increasing the emitting current and deepening the focus depth. Accordingly, when a three-dimensional structure is inspected, an optical condition is required in which the beam diameter representing the resolution is not increased by setting the aperture angle αi to be an acute angle and controlling the information signal.

Even when the condition of the primary charged particle beam 36 is determined so as form the predetermined aperture angle αi as described above, if the lens 50 is operated in order to control the orbit of the information signal 33, the predetermined aperture angle is not formed.

Therefore, as illustrated in FIG. 15, it is possible to control not only the orbit of the information signal 33 but also the orbit of the primary charged particle beam 36 by disposing the lens 60 in addition to the lens 50. FIG. 15 illustrates details thereof. As described above, the orbit of the information signal 33 is controlled by the lens 50. When the orbit of the information signal 33 is optimized, the orbit, that is, an optical condition of the primary charged particle beam 36 is not necessarily optimal for observation and inspection. Therefore, the orbit of the primary charged particle beam 36 is optimized by the lens 60, that is, the aperture angle is controlled by the lens 60.

As illustrated in FIG. 15, the lens 50 is arranged between the control plate 40 which partially restricts passage of the electron emitted from the sample and the sample 13, and the lens 60 is arranged between an object point of the objective lens and the control plate 40. In this manner, it is possible to compatibly realize the optimized adjustment of the focusing condition of the electron beam and the optimized adjustment of the orbit of the electron emitted from the sample. Specifically, the lens 50 is controlled so that the electron emitted at a desired emitting angle can selectively pass through an opening (electron beam passing opening) of the control plate 40. The lens 60 is controlled so as to compensate for a change in the focusing condition of the electron beam resulted from the condition change of the lens 50.

The lens 60 is arranged on the electron source side further from the control plate 40. The angle of the electron emitted from the sample is discriminated by using the control plate 40, and then, is focused. Accordingly, it is possible to focus the electron beam without changing the condition for discriminating the angle. In addition, the lens 60 is arranged on the sample 13 side further from the object point of the objective lens 9. Accordingly, the object point position of the electron beam which is changed due to the adjustment of the lens 50 can be returned to its initial position. Instead of the control plate 40, the detector may be directly arranged.

Hereinafter, an example of the control method will be described. For example, an optimal optical system is first selected depending on a state of the sample 13 to be inspected. For example, the autofocus is performed so as to readjust the lens condition in a case where the primary charged particle beam. 36 is focused on the sample surface as illustrated in FIG. 14(*b*). The lens condition of the objective lens 9 is adjusted so that the primary charged particle beam 36 is focused on the bottom portion 59. In this case, the aperture angle of the electron beam shows αi (1) (for example, 5 [mrad]) as illustrated in FIG. 14(*a*). Next, a condition of a detection system is selected. The detector 21 is selected in order to mainly forming an image for information transmitted from the bottom portion 59. If the lens 50 is controlled so that only the required information signal 33 passes through the control plate 40 as illustrated in FIG. 3 or FIG. 4, the information signal 33 can be efficiently detected by the detector 21. The image is formed for the information signal 33 of the bottom portion 59, and the lens 50 is controlled so that desired contrast or image quality can be obtained. However, in this case, the operation of the lens 50 also operates on the primary charged particle beam 36. Accordingly, the above-described αi (1) (5 [mrad]) is not necessarily maintained.

That is, the lens 60 for controlling the primary charged particle beam 36 needs to be linked with the lens 50. For example, if a linking relationship between the lens 50 and the lens 60 is calculated in advance as illustrated in FIG. 16, the control is simplified. Herein, the lens 50 and the lens 60 are assumed as an electrostatic type, and the graph indicates an applying voltage. In a case of an electromagnetic field type, the lenses are controlled by using a value of a current flowing in a coil.

On the other hand, even when a form of the sample 13 is recognized, a material of the sample or an electrical feature thereof cannot be specified in some cases. In this case, according to a control function as illustrated in FIG. 16, the control is insufficiently performed. Accordingly, it is necessary to optimize the control while an image is viewed. FIG. 17 illustrates the control flow. First, a form of the sample to be inspected and observed is recognized (Step 101). Next, an optimal optical condition is selected (Step 102). An optimal detection condition is selected through Step 101 and Step 102 (Step 103). An image is acquired, thereby confirming that a desired image is obtained (Step 104). It is confirmed whether the image is suitable for observation and inspection, thereby determining whether or not the inspection is available (Step 105). If it is determined that the inspection is available, the inspection is performed (Step 109). However, in a case where it is determined in Step 105 that the inspection is not available for some reasons, the orbit of the information signal 36 is first adjusted, and image quality is adjusted (Step 106). Next, the lens 60 is controlled so as to set the optical condition selected in Step 102 (Step 107).

FIG. 18 illustrates a case where a three-dimensional structure and a planar portion are mixed with each other in one sample. In this case, each portion has a different optical condition which is optimal for the inspection. In a case where the sample surface is inspected in a region 201 and the three-dimensional structure, for example, the bottom portion is inspected in a region 202, it is difficult to inspect both of these under the same optical condition. For example, an optical condition of high-resolution is suitable for a case where the sample surface is inspected in the region 201. In contrast, in a case where the three-dimensional structure of the bottom portion is inspected in the region 202, it is preferable to set an optical condition in which a beam form shows an acute angle as illustrated in FIG. 14(*a*) and the primary charged particle beam 36 reaches the bottom portion 59. In order to simultaneously perform the inspection under the different conditions, it is necessary to quickly switch the optical condition for each region. According to a configuration in which the lens 50 or the lens 60 is an electrostatic-type lens as illustrated in FIG. 12, the optical condition can be quickly switched. In a case of an electromagnetic field-type lens in FIG. 11, there is a problem of late response, and thus, the electromagnetic field-type lens is not suitable for the quick switching.

If switching the optical condition is not available, the image is acquired and inspected one by one under each condition. Consequently, it takes time to obtain the inspection result. Since improved throughput is one factor required for an inspection device, quickened inspection is indispensable.

FIG. 19 illustrates an example of the image obtained consequently. In fact, an image focused on the sample surface is obtained in the region 201, and an image focused on the bottom portion 59 is obtained in the region 202. In this manner, the inspection can be performed by using one image.

Next, the charged particle beam apparatus will be schematically described which includes a more specific adjusting function of the lenses 50 and 60. FIG. 20 illustrates an example of graphical user interface (GUI) screen displayed on the image display device 32. Based on setting information of the GUI screen, the control unit 31 controls each configuration element of the electron microscope. The image processing unit 37 performs predetermined image processing or arithmetic processing. The GUI screen illustrated in FIG. 20 has an input window 2002 for inputting information of an object pattern (target) which is a measurement or inspection object, an input window 2003 for inputting measurement condition information, an input window 2004 for inputting a condition of a region of interest (ROI) set at a desired position on an SEM image (or layout data), and an SEM image display region 2005. The SEM image output from the image processing unit 37 is displayed on the SEM image display region 2005. In the example in FIG. 20, a groove-shaped pattern which is long in a direction y is displayed in the SEM image display region 2005.

The input window 2002 has an input unit for selecting or inputting a name of the object pattern and coordinates of the pattern. Based on setting in the input unit, the control unit 31 controls the sample stage 12 or a visual field moving beam deflector (not illustrated) so as to locate the object pattern at an electron beam scanning position. In addition, the input window 2003 has an input unit for selecting or inputting a type of patterns, a measurement purpose, and a specific measurement algorithm used for measurement. For example, the type of patterns includes a line-and-space pattern formed on a semiconductor device, and a hole pattern. In addition, a configuration may be adopted in which the input unit for inputting these can select the measurement purpose or the measurement algorithm depending on the type of patterns in accordance with the input or selection in the input unit for inputting the type of patterns. For example, if the type of patterns is the line-and-space pattern (pattern in which line patterns are equally arrayed), the input unit for inputting the measurement purpose selects or inputs the measurement purpose of a line width, a space width, or a pitch. In addition, if the type of patterns is the hole pattern, the measurement purpose is a diameter of the hole bottom, a diameter of a hole upper portion, or a diameter of an intermediate layer of the hole.

In addition, the input unit for setting the measurement algorithm selects or inputs a specific measurement algorithm by using a line profile formed based on the SEM image, for example. More specifically, the algorithm for measuring a dimension between edges of a threshold method is selected.

In the input window 2004, a specific condition of ROI (a position or a size of ROI) to be set on the SEM image to be displayed in the SEM image display region 2005 is set. A groove-shaped pattern interposed between two edges 2007 is displayed in the SEM image display region 2005 illustrated in FIG. 20. Furthermore, a portion 2008 formed of a material A and a portion 2009 formed of a material B are present in the groove bottom. For example, in a case where the measurement purpose is the dimension in the direction y of the portion 2008, a device condition may be set so that image quality of the portion 2008 and the portion 2009 becomes satisfactory. In addition, in a case where the measurement purpose is to measure not only the pattern located at the groove bottom but also the groove width (dimension on the sample surface between two edges 2007), it is necessary to collectively adjust not only the image quality of the bottom portion but also the image quality of the sample surface 2006.

In order to set a proper optical condition according to the measurement purpose, the GUI screen illustrated in FIG. 20 enables settings such as "a pattern bottom portion", "a pattern bottom portion and a sample surface", and "a sample surface" as the measurement purpose, for example. For example, in a case where "the bottom portion" is selected as the measurement purpose, an ROI 2010 selectively surrounding the bottom portion is superimposed and displayed on the SEM image. In a case where "the pattern bottom portion and the sample surface" are selected as the measurement purpose, an ROI 2011 in addition to the ROI 2010 is superimposed and displayed on the SEM image. Since the ROI having the number according to a desired measurement height can be set in this way, the proper optical condition according to the measurement purpose can be set.

In the present embodiment, the GUI screen for optionally setting a region for performing image quality evaluation (ROI) is described. However, in a case where a measurement object image is present in advance, a template may be formed based on the image, and pattern matching may be performed by using the template. In this manner, the ROI may be automatically extracted.

Next, a process of setting the optical condition based on the condition set by using the GUI screen illustrated in FIG. 20 will be described with reference to a flowchart illustrated in FIG. 21. First, an initial optical condition for acquiring the SEM image is set (Step 2101). Here, a focus condition is adjusted by using the autofocus, and the image is acquired by performing scanning with the adjusted beam (Step 2102). Then, the ROI is set on the acquired image (Step 2103). When the ROI is set, it is conceivable to use an automatic selecting method based on a numerical input to the window 2004, region designation using a pointer 2012, or a preset ROI setting condition using setting data.

Next, image quality is evaluated for a region where the ROI is set (Step 2104). The image quality evaluation herein is reflected in the condition adjustment of the lens 50. Accordingly, in a case where the measurement purpose is "the bottom portion", the image quality is evaluated inside the ROI allocated to "the bottom portion". In a case where the measurement purpose is "the bottom portion" and "the sample surface", the image quality is evaluated inside each allocated ROI. In a case where the ROI is set in the bottom portion of the hole pattern illustrated in FIG. 6, the electron emitted at an emitting angle which is larger than the emitting angle θ is excluded, and the electron emitted within the emitting angle θ is selectively detected. In this manner, it is possible to form the image which emphasizes the hole bottom. In addition, in a case where the measurement purpose is "the bottom portion" and "the sample surface", it is determined whether or not the image quality of the ROI allocated to both of these satisfies a predetermined condition.

The image quality is evaluated inside the ROI as described above. In a case where the image quality is not suitable, the lens 50 is adjusted (Step 2105), and the image quality of the ROI is evaluated again. In the flowchart in FIG. 21, whenever the lens is adjusted, it is determined whether or not the ROI satisfies the predetermined condition. However, without being limited thereto, for example, the image may be formed by setting the lens 50 under multiple conditions so as to select a condition of the lens 50 which provides the best image quality of the ROI. In addition, compared to the electron emitted from the sample surface, the relatively smaller number of electrons is emitted from the bottom portion. Accordingly, the lens condition providing the best image quality of "the bottom portion" and the lens condition providing the best image quality of "the sample surface" are different from each other. Therefore, if the lens condition providing the best image quality of "the bottom portion" is a lens condition which is also allowable for the image quality of "the sample surface", the lens condition may be selected.

In a case of the pattern as illustrated in FIG. 20, the ROI 2010 is set across the portion 2008 and the portion 2009. The image quality is evaluated in such a way that whether or not the contrast (brightness difference) between both portions satisfies a predetermined condition (whether or not the brightness difference is equal to or greater than a predetermined value) serves as an evaluation reference. This evaluation enables a user to notice the optical condition when the dimension of the portion 2008 is measured. Furthermore, it is also conceivable to set the lens condition providing the smallest brightness difference between the ROI 2011 and the ROI 2010 (that is, a lens condition considered that a largest number of electrons is emitted from the bottom portion) to be the condition of the lens 50. In addition to the contrast, the image quality may be evaluated by using an SN ratio as an evaluating parameter. The condition for improving the image quality of the bottom portion also has a possibility of degrading the image quality of the sample surface. Accordingly, while the contrast or the SN ratio of the sample surface is adjusted to be a certain threshold or greater, the lens condition may be adjusted so as to maximize the contrast of the bottom portion.

In accordance with a feature of the pattern set in the input window 2004, an image quality condition of each ROI (an evaluating parameter or a threshold) may be automatically set. As described above, compared to the sample surface, the bottom portion has the less number of detectable electrons. Accordingly, it is difficult to obtain the contrast which is equal to that of the sample surface. Therefore, particularly in a case where the ROI is set at multiple locations, it is desirable that an image evaluation reference can be set according to the portion having the set ROI. For example, in a case where the ROI is set to be located in the groove bottom in the input window 2004, compared to a case where the ROI is set on the sample surface, it is conceivable to automatically set an evaluation reference having a small threshold of allowable contrast.

After the lens 50 is optimally adjusted, a state of the lens 50 is maintained, and then, a focus state of the bottom portion having the set ROI (including the sample surface in a case where the ROI is also set on the sample surface) is evaluated (Step 2106). For example, in order to evaluate the focus state, a focus evaluation value such as sharpness inside the ROI is obtained, and the lens 60 is adjusted so that the evaluation value is the greatest value or is equal to or greater than a predetermined value (Step 2107). At this time, in a case where the measurement purpose is only the dimension of the pattern bottom portion (in a case where the ROI is set in only the pattern bottom portion), the lens 60 is adjusted so as to focus the beam on the pattern bottom portion. More specifically, since the focus is shifted by adjusting the lens 50, the beam is focused on the sample by using the objective lens. Thereafter, the lens 60 is adjusted by observing the bottom portion. In this case, until the image condition of the bottom portion satisfies a predetermined condition, a process is performed so as to repeat the observation of the bottom portion and adjustment of the lens.

In addition, in a case where two or more ROIs are set in order to measure both the pattern bottom portion and the sample surface, the condition of the lens 60 is set so that the focus evaluation value of both the ROIs satisfies a predetermined condition. Specifically, as illustrated in FIG. 22, the condition of the lens 60 is set so as to reach a lens strength level (for example, a focus evaluation value $I_1$ of an intersection point 2203 between an evaluation value waveform 2201 of an ROI1 and an evaluation value waveform 2202 of an ROI2) in which the evaluation value of the two ROIs is a predetermined value or greater, and which corresponds to the center between peaks of the two evaluation value waveforms. The evaluation value herein represents an index value indicating a greater value as the sharpness of the image is closer to a just-focus position. Even if multiple portions having different heights are present in a visual field, this adjustment enables a user to measure the multiple portions under the focus condition corresponding to each portion.

In a case where the intersection point between the two waveforms does not reach a predetermined threshold (Th), a case is considered where the beam is less likely to be focused on both the sample surface and the bottom portion under the current condition of the lens 50, or where the beam is less likely to be simultaneously focused on both the sample surface and the bottom portion since the hole is too deep. Accordingly, the condition of the lens 50 may be revised, and the image display device 32 may be caused to display a message prompting an operator to adjust the lens condition of the lens 50 again or an error indicating that focus adjustment is not simultaneously available for both the sample surface and the bottom portion.

The lens 60 is arranged on the electron source side further from the control plate 40 (orbit restricting aperture for controlling the orbit of the electron emitted from the sample). Accordingly, the lens 60 does not affect the angle discrimination condition used by the control plate 40. Therefore, without changing the angle discrimination condition which is optimally adjusted by setting the lens 50 (while a setting state of the lens 50 is maintained), it is possible to optimally adjust the focus condition for the measurement object portion. A general electromagnetic field lens is a convex lens, and the focusing strength can be adjusted. Reversely, the electron beam cannot be diverged. On the other hand, a case is also considered where in order to correct the focusing condition of the electron beam changed by the adjustment of the lens 50, it is necessary not only to focus the electron beam but also to diverge the electron beam. Therefore, in Step 2101, it is desirable that the optical condition under which the electron beam can be relatively diverged is prepared for an initial state by exciting the lens 60 to some extent. In this case, for example, in Step 2101, the objective lens 9 and the lens 60 are caused to cooperate with each other, and the autofocus is performed, thereby bringing the lens 60 into an excited state to some extent.

The image is acquired, and it is determined whether or not the lens condition of the lens 50 and the lens 60 which are adjusted through the above-described process satisfies the predetermined condition (Step 2108). In a case where the lens condition satisfies a predetermined condition, the set lens condition is registered as an imaging recipe. Alternatively, the measurement or the inspection starts under the lens condition (Step 2109).

According to the input device having an input screen as illustrated in FIG. 20, and the control unit 31 storing a program for performing the adjustment as illustrated in FIG. 21, based on the condition input by the input device, and the image processing unit 37 (arithmetic device), an operator can perform very accurate measurement or very accurate inspection based on a proper optical condition, without calculating the orbit of the electron emitted from the sample.

REFERENCE SIGNS LIST

1: ELECTRON GUN
2: ELECTRON SOURCE
3: EXTRACTION ELECTRODE
4: ACCELERATION ELECTRODE
5: LENS POWER SOURCE
6: ELECTRIC FIELD CONTROL UNIT
7: LENS
8: LENS
9: OBJECTIVE LENS
10: CROSSOVER
11: POSITION MONITORING MEASUREMENT DEVICE
12: SAMPLE STAGE
13: SAMPLE
14: VARIABLE DECELERATION POWER SOURCE
15: DIAPHRAGM
16a,16b: DEFLECTOR
17: ELECTRODE
18: ELECTRODE
19: VOLTAGE CONTROL UNIT
20: CROSSED ELECTROMAGNETIC FIELD GENERATOR
21: DETECTOR
22: CONTROL UNIT
23: STAGE DRIVE DEVICE
24: SCANNING SIGNAL GENERATION DEVICE
27: STORAGE UNIT
31: CONTROL UNIT
32: IMAGE DISPLAY DEVICE
33: INFORMATION SIGNAL
34: INFORMATION SIGNAL
36: PRIMARY BEAM
37: IMAGE PROCESSING UNIT
40: CONTROL PLATE
41: IMAGE
43: OPTICAL AXIS
44: CONTROL UNIT
50: CONTROL LENS

51: CONTROL LENS
55: ENERGY FILTER
56: ENERGY FILTER
57: ELECTROMAGNETIC FIELD-TYPE LENS
58: ELECTROSTATIC-TYPE LENS
59: BOTTOM PORTION OF THREE-DIMENSIONAL STRUCTURE
60: SAMPLE SURFACE

The invention claimed is:

1. A charged particle beam apparatus including a focusing lens for focusing a charged particle beam emitted from a charged particle source and an objective lens for focusing and emitting the charged particle beam focused by the focusing lens to a sample, comprising:
   a passage opening restriction member, including a passage opening through which a part of charged particles emitted upward from the sample and the charged particle beam emitted from the charged particle source pass, that partially restricts passage of the charged particle emitted upward from the sample;
   a detector configured to detect a new charged particle generated by collision of the passage opening restriction member and the charged particle emitted from the sample and for which a passage is restricted by the passage opening restriction member;
   a first lens that is arranged between the passage restriction member and the sample, and that controls an orbit of the charged particle emitted from the sample; and
   a second lens that is arranged between the passage restriction member and the charged particle source, and that changes a focusing condition of the charged particle beam in accordance with a control condition of the first lens.

2. The charged particle beam apparatus according to claim 1,
   wherein the second lens is arranged between an object point of the objective lens and the passage restriction member.

3. The charged particle beam apparatus according to claim 1, further comprising:
   a detector configured to detect the charged particle which is emitted from the sample and passes through the passage opening restriction member or a new charged particle generated by the charged particle colliding with other members.

4. The charged particle beam apparatus according to claim 1,
   wherein the passage restriction member includes an opening through which the charged particle beam emitted from the charged particle source passes.

5. A charged particle beam apparatus including a focusing lens for focusing a charged particle beam emitted from a charged particle source and an objective lens for focusing and emitting the charged particle beam focused by the focusing lens to a sample, comprising:
   a passage opening restriction member, including a passage opening through which a part of charged particles emitted upward from the sample and the charged particle beam emitted from the charged particle source pass, that partially restricts passage of the charged particle emitted upward from the sample;
   a detector configured to detect a new charged particle generated by collision of the passage opening restriction member and the charged particle emitted from the sample and for which a passage is restricted by the passage opening restriction member;
   a first lens that is arranged between the passage restriction member and the sample;
   a second lens that is arranged between the passage restriction member and the charged particle source;
   a detector configured to detect the charged particle obtained based on the charged particle beam emitted to the sample; and
   a control device configured to control the first lens and the second lens;
   wherein the control device is configured to control the first lens so that at least one portion of an image, generated based on an output of the detector, is brought into a predetermined state, and while maintaining the control of the first lens, the control device is configured to control the second lens so that at least one portion of the image is brought into a predetermined state.

6. The charged particle beam apparatus according to claim 5,
   wherein the second lens is arranged between an object point of the objective lens and the passage restriction member.

7. The charged particle beam apparatus according to claim 5,
   wherein the control device is configured to control the first lens so that contrast of at least one portion of the image satisfies a predetermined condition.

8. The charged particle beam apparatus according to claim 5,
   wherein the control device is configured to control the first lens so that contrast of at least one portion of the image satisfies a predetermined condition, and further controls the second lens so that a focus evaluation value of at least one portion of the image satisfies a predetermined condition.

9. The charged particle beam apparatus according to claim 5,
   wherein the control device is configured to control the first lens so that both a first portion and a second portion inside the image are brought into a predetermined image state, and is configure to further control the second lens so that both the first portion and the second portion are brought into a predetermined image state.

10. The charged particle beam apparatus according to claim 9,
    wherein the control device is configured to control the first lens so that image contrast of the first portion and the second portion inside the image is brought into a predetermined state, and while maintaining a state of the first lens, the control device is configured to control the second lens so that a focus evaluation value of the first portion and the second portion satisfies a predetermined condition.

* * * * *